United States Patent [19]

Clark et al.

[11] 4,047,218
[45] Sept. 6, 1977

[54] SEMICONDUCTOR DEVICES WITH IMPROVED TURN-OFF CHARACTERISTICS

[75] Inventors: Lowell E. Clark; Raymond M. Roop; Charles E. Volk, all of Scottsdale, Ariz.

[73] Assignee: Motorola, Inc., Chicago, Ill.

[21] Appl. No.: 705,970

[22] Filed: July 16, 1976

Related U.S. Application Data

[63] Continuation of Ser. No. 543,584, Jan. 23, 1975, abandoned.

[51] Int. Cl.² ............... H01L 29/72; H01L 29/48; H01L 29/90; H01L 23/48
[52] U.S. Cl. ............................ 357/34; 357/15; 357/13; 357/65; 357/90

[58] Field of Search ................ 357/34, 15, 65, 13, 357/90

[56] References Cited

U.S. PATENT DOCUMENTS 3,930,909  1/1976  Schmitz et al. .................. 357/90

Primary Examiner—Edward J. Wojciechowicz
Attorney, Agent, or Firm—Lowell E. Clark

[57] ABSTRACT

Semiconductor devices, with especial reference to transistors with reduced turn-off times. This improvement includes a low-barrier height metal contact to one of the lightly-doped regions of the device as a replacement for the conventional heavily-doped region or high-low junction structure usually employed for the purpose of providing ohmic contact.

5 Claims, 4 Drawing Figures

SEMICONDUCTOR DEVICES WITH IMPROVED TURN-OFF CHARACTERISTICS

This is a continuation of application Ser. No. 543,584, filed Jan. 23, 1975 now abandoned.

RELATED APPLICATION

Patent Application Ser. No. 521,706 filed Nov. 7, 1974, now U.S. Pat. No. 3,911,461, and assigned to the assignee of the present invention.

BACKGROUND OF THE INVENTION

This invention relates to high-voltage semiconductor switching devices and more particularly to a structure for reducing the fall time in high-voltage transistors.

Bipolar semiconductor devices in general, have turn-off time limited by stored charge. High voltage devices thus turn-off particularly slowly because the relatively thick lightly-doped regions required for high-voltage capability are very susceptible to charge storage. While storage time per se may not be particularly important in a high-voltage, low frequency application, stored charge also leads to long fall times, which engender excessive power dissipation.

In a high-voltage transistor, for example, it is known to decrease this fall-time by providing narrow emitters, so that stored charge can be removed rapidly laterally from base and collector regions. Such an approach however conflicts with the requirement for large current handling capability in the one condition. Similarly, lifetime reduction to minimize the stored charge is in direct conflict with the requirement for high current gain in the on condition.

BRIEF SUMMARY OF THE INVENTION

It is the purpose of this invention to reduce the amount of stored charge per unit area in devices of given breakdown and saturation voltage capabilitites by controlling the amount and distribution of the doping in at least one of the lightly doped regions. It is traditional to achieve ohmic contact to a lightly doped semiconductor region by the use of a heavily doped region of the same conductivity type interposed between the lightly-doped region and a metallic contact. Because the heavily doped region is relatively impermeable to minority carriers, the minority charge storage in the adjacent lightly-doped region is enhanced. By replacing the heavily doped region with a more lightly doped region or directly by a metallic contact of low barrier height, much more minority carrier flow from the lightly doped region can occur without substantial increase in the voltage drop. By providing an intermediate region of limited total doping but high doping concentration, the need for a low barrier contact may be obviated. In addition, the intermediate region of limited total doping may be useful in preclusion of electrical punch through of the lightly doped region, when reverse voltage is applied across an adjacent junction. Further, by eliminating the need for the heavily doped intermediate system, this invention allows simplification of the processing schedule used to make high voltage devices.

THE DRAWINGS

Further objects and advantages of the invention will be understood from the following complete description thereof and from the drawings wherein.

DETAILED DESCRIPTION OF THE INVENTION

Figure 1:
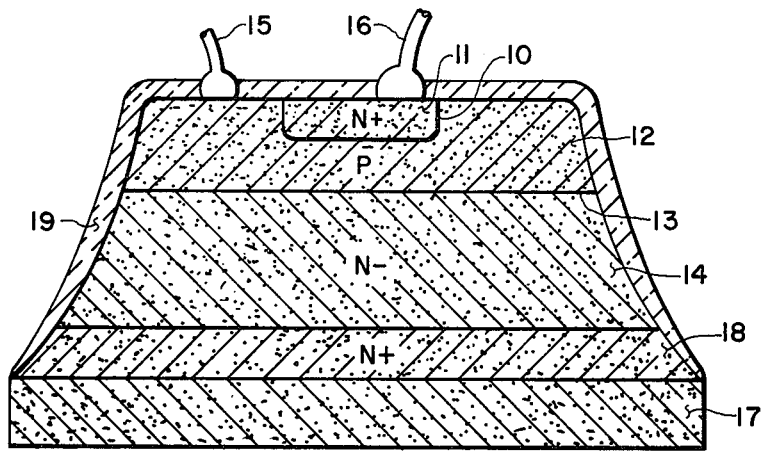
FIG. 1 is a cross section of representative prior art transistor.

FIG. 1 sets out an example of a typical high-voltage transistor structure of the prior art. The collector region 14 is sufficiently lightly doped and thick enough to support the required breakdown voltage. Interposed between this lightly doped region 14 and the metallic collector contact 17, which is selected only on the basis of mechanical properties, is the heavily doped region 18 of the same conductivity type as region 14. This region is typically either a substrate of 0.01 ohm centimeter resistivity and at least 100 microns thick, or a heavily-diffused portion of the semiconductor wafer with a sheet resitivity less than 5 ohms per square. In either case, the total doping in this heavily doped collector contact region is usually, on the order of $10^{17}$ doping atoms per square centimeter.

From studies of current gain of bipolar transistors it is known that a doping of only $5 \times 10^{15}$ atoms per square centimeter is adequate to achieve high emitter efficiency, that is, minority carrier injection into such a heavily doped region is essentially suppressed.

Figure 2:
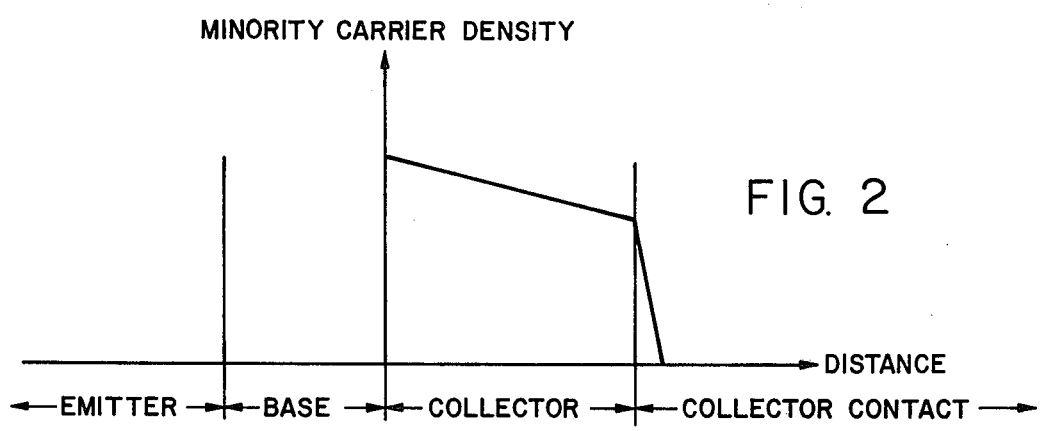
FIG. 2 is a representation of spatial distribution of the collector minority carrier density in saturated prior art devices.

FIG. 2 shows an example of the minority carrier density profile in the regions 14 and 18 (collector and collector contact, respectively) when the transistor is turned on hard or saturated. Because of the opacity of the collector contact region to minority carrier flow, very little base current is required to maintain the excess carrier density depicted in FIG. 2, and substantial stored charge results. Some excess minority charge is of course desirable because it serves to reduce the series resistance of the collector region by conductivity modulation.

Figure 3:
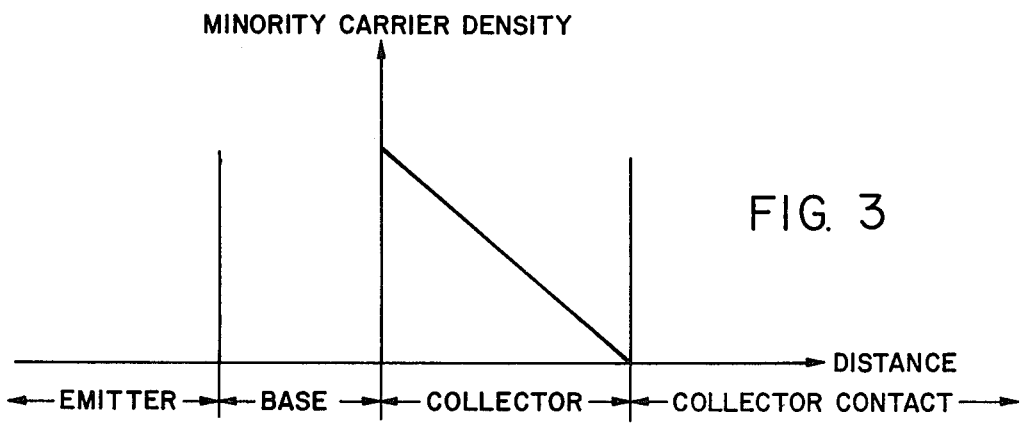
FIG. 3 is the spatial distribution of the collector minority carrier density in a device constructed according to the preferred embodiments of the invention.

From the standpoint of reducing the stored charge, however, the minority carrier density profile of FIG. 3 is preferable, hence the collector contact of FIG. 2 has been replaced by a region which is transparent to the flow of minority carriers, so that no excess density can be achieved at the collector-collector contact boundary. Across most of the collector, however, an excess charge is maintained, thus reducing the series resistance in a desirable fashion.

One way to achieve a relatively transparent collector contact region is to directly interface the collector with a metal forming a low barrier height system with the collector.

Figure 4:
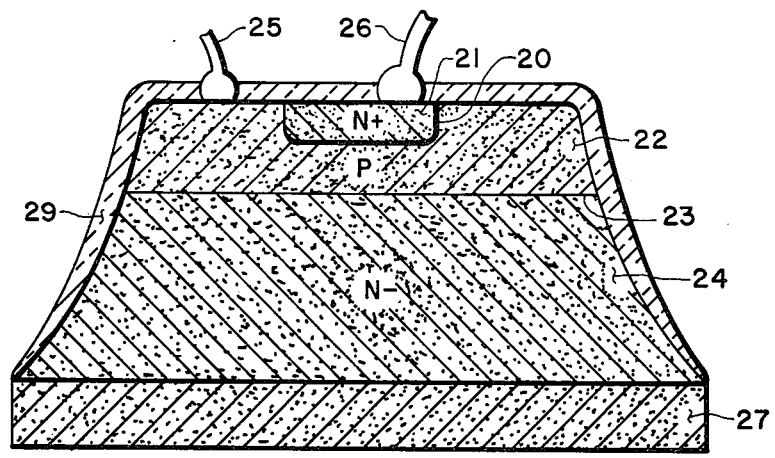
FIG. 4 is a cross section of the device illustrating the present invention.

This is shown in FIG. 4, where metallic contact 27 is in direct contact with high-resistivity layer 24. Such a system is well known to result in large majority current flow at a very low voltage, without substantial injection of minority charge density. For example, a titanium silicon contact could flow several milliamps per squre mil with less than 200 millivolts potential drop, and the minority carrier density in the collector immediately adjacent to the interface could be reduced by at least two orders of magnitude over the case where the collector contact is a heavily-doped region of the same conductivity type as the collector.

One disadvantage of such a structure would be that, under reverse bias conditions, electrical punch-through of the collector by the application of collector-base bias could occur. For silicon, avalanche breakdown occurs at or below a peak field strength of 48 volts per micron for resistivities in excess of 1 ohm cm. Thus by Gauss' law, a doping density of about $3 \times 10^{12}$ atoms per square centimeter would be required to terminate the collector bass electric field, in order that electrical punch-through not result in premature breakdown. Such a large areal doping density would not be present in a collector of $10^{14}$ atoms per cubic centimeter doping and 100 micron thickness, with an areal doping density of $10^{12}$ atoms per square centimeter.

As stated previously, it has been found that high emitter efficiency, or relative opacity to minority carrier flow, is obtained with an areal doping density of $5 \times 10^{15}$. It has been found that the emitter efficiency is roughly proportional to the doping density at values below this level. That is, the opacity of the larger, and hence the charge storage in an adjacent lighter-doped layer, such as the collector, is reduced as the doping is reduced substantially below $5 \times 10^{15}$ atoms per square centimeter. Thus, a collector contact region of $10^{13}$ atoms per square centimeter would significantly reduce the charge storage in the collector region of transistor in the saturated condition, and yet still preclude punch-through of the collector to the collector with contact. Of course, this areal doping density should be achieved in a relatively thin layer, substantially less than minority carrier diffusion length, so that the collector contact region does not add appreciably to the series resistance of the device. Ideally, the required areal doping density would be achieved in such a short distance that the volumetric density adjacent the metal contact would be in excess of $10^{17}$ atoms per cubic centimeter, so that good ohmic contact would be afforded by tunneling action. In this case, the use of a low barrier-height metal system would not be required. This embodiment of the invention is substantially shown by FIG. 1 subject to the disclosed restriction on the areal doping density of region 18. Such thin layers, might be achieved, for example, by the well known technique of ion implantation.

While this invention has been described by reference to three semiconductor layer transistor structures, the principles discussed are applicable to two-layer devices (diodes) and multi-layer devices, such as thyristors. While the invention has been described in relation to preferred embodiment thereof, those skilled in the art will recognize that various changes may be made to suit specific requirements without departing from the scope of the invention.

What is claimed is:

1. In a high voltage semiconductor device including a first region of first conductivity-type, a second semiconductor region of second conductivity-type having at least lightly-doped portion, said lightly-doped portion forming a p-n junction with said first region, and separate first and second metallic means for contacting respectively each of said first and second regions remote from their p-n junction, wherein the improvement comprises said second region having a net impurity doping density of said second type between $3 \times 10^{12}$ and $10^{15}$ atoms per square centimeter between said p-n junction and said second metallic means.

2. A semiconductor device as recited in claim 1 where said second metallic means and said second region have a low barrier height contact.

3. A semiconductor device as recited in claim 1, further having a third region of second conductivity type in p-n junction forming relation with said first region and third metallic means for contacting said third region, where said first region is the base, said second region is the collector, and said third region is the emitter of a bipolar transistor.

4. A semiconductor device as recited in claim 3, where the impurity doping density in said second region is highest adjacent said second metallic means.

5. A semiconductor device as recited in claim 4, where the high doping density in said second region adjacent said second metallic means has a thickness substantially less than a minority carrier diffusion length.

* * * * *